United States Patent
Woo et al.

(10) Patent No.: US 9,252,164 B2
(45) Date of Patent: Feb. 2, 2016

(54) DISPLAY DEVICE AND METHOD FOR MANUFACTURING THE SAME

(75) Inventors: YoonHwan Woo, Seoul (KR); Heesun Shin, Gyeonggi-do (KR); Gyoung-A Kim, Jeollanam-do (KR)

(73) Assignee: LG Display Co., Ltd., Seoul (KR)

( * ) Notice: Subject to any disclaimer, the term of this patent is extended or adjusted under 35 U.S.C. 154(b) by 66 days.

(21) Appl. No.: 13/607,958

(22) Filed: Sep. 10, 2012

(65) Prior Publication Data
US 2013/0249820 A1    Sep. 26, 2013

(30) Foreign Application Priority Data
Mar. 26, 2012    (KR) .................. 10-2012-0030543

(51) Int. Cl.
| | | |
|---|---|---|
| H01L 29/786 | (2006.01) | |
| G06F 3/041 | (2006.01) | |
| H01L 27/12 | (2006.01) | |
| G02F 1/1333 | (2006.01) | |
| G02F 1/1343 | (2006.01) | |
| G02F 1/1362 | (2006.01) | |

(52) U.S. Cl.
CPC ........ *H01L 27/1248* (2013.01); *G02F 1/13338* (2013.01); *G02F 1/134309* (2013.01); *G02F 1/136227* (2013.01); *G06F 3/041* (2013.01); *G02F 2001/134372* (2013.01); *H01L 27/124* (2013.01)

(58) Field of Classification Search
None
See application file for complete search history.

(56) References Cited

U.S. PATENT DOCUMENTS

| | | | | |
|---|---|---|---|---|
| 5,736,438 | A * | 4/1998 | Nishimura et al. | 438/166 |
| 2002/0101557 | A1 | 8/2002 | Ono et al. | |
| 2005/0181538 | A1* | 8/2005 | Tsai | 438/108 |
| 2006/0097265 | A1* | 5/2006 | Jeong et al. | 257/72 |
| 2007/0166893 | A1* | 7/2007 | Lee et al. | 438/151 |
| 2007/0222907 | A1 | 9/2007 | Onogi et al. | |
| 2008/0180622 | A1* | 7/2008 | Horiguchi et al. | 349/139 |
| 2009/0027579 | A1 | 1/2009 | Aota et al. | |
| 2009/0121229 | A1* | 5/2009 | Saitou et al. | 257/59 |
| 2010/0073612 | A1* | 3/2010 | Kim et al. | 349/106 |
| 2010/0134710 | A1 | 6/2010 | Ishitani et al. | |
| 2012/0162584 | A1* | 6/2012 | Chang et al. | 349/106 |

FOREIGN PATENT DOCUMENTS

| | | |
|---|---|---|
| CN | 101063776 A | 10/2007 |
| CN | 101354513 A | 1/2009 |
| CN | 101750821 A | 6/2010 |

OTHER PUBLICATIONS

The First Office Action dated Jun. 3, 2015 from The State Intellectual Property Office of the People's Republic of China in counterpart Chinese application No. 201210402235.4.

* cited by examiner

*Primary Examiner* — Nicholas Lee
*Assistant Examiner* — Duane N Taylor, Jr.
(74) *Attorney, Agent, or Firm* — Morgan, Lewis & Bockius LLP (57) ABSTRACT

Discussed is a display device. The display device includes a thin film transistor, a first protective layer, a second protective layer, a pixel electrode, a connection line, a third protective layer, and a common electrode.

19 Claims, 8 Drawing Sheets

FIG. 1

[ Related Art ]

FIG. 2

[ Related Art ]

FIG. 3

[ Related Art ]

DISPLAY DEVICE AND METHOD FOR MANUFACTURING THE SAME

CROSS-REFERENCE TO RELATED APPLICATIONS

This application claims the priority benefit of the Korean Patent Application No. 10-2012-0030543 filed on Mar. 26, 2012, which is hereby incorporated by reference in its entirety.

BACKGROUND

The present disclosure relates to a display device, and more particularly, to a display device with an integrated touch screen.

A related art display device is described with reference to FIGS. 1 to 3.

Figure 1:
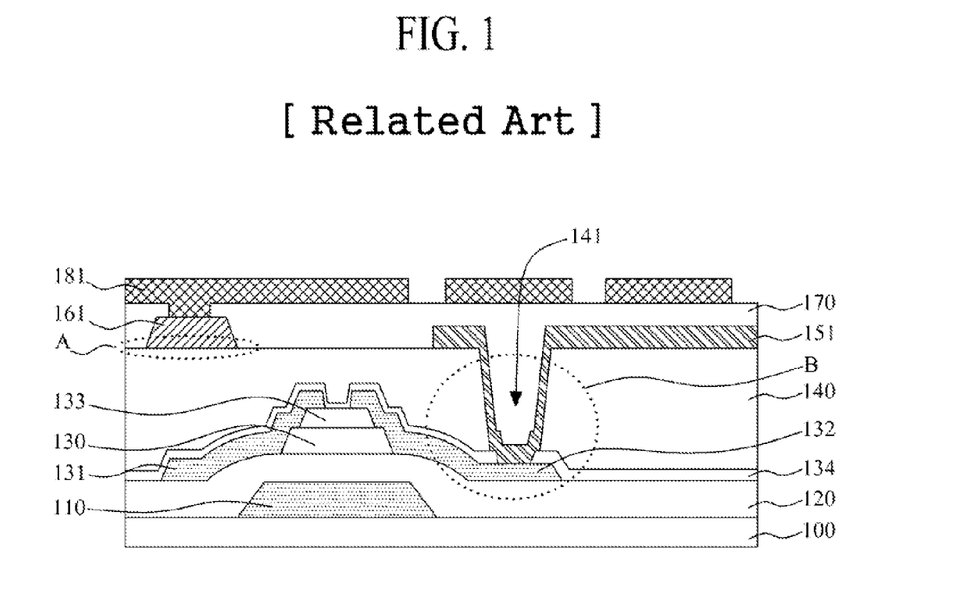
FIG. 1 is a sectional view of one pixel area of a related art display device.

FIG. 1 is a sectional view of one pixel area of a related art display device. FIGS. 2 and 3 are varied views of portion B of FIG. 1. The related art display device as illustrated in FIG. 1, includes a substrate 100, a thin film transistor that is a switching element, a first protective layer 134, a second protective layer 140, a pixel electrode 151, a connection line 161, a third protective layer 170, and a common electrode 181.

The thin film transistor is formed in a unit pixel area, and includes a gate electrode 110, a gate insulation layer 120, an active layer 130, a source electrode 131, a drain electrode 132, and an etch stopper 133.

The first protective layer 134 and the second protective layer 140 are formed on the thin film transistor, and particularly, the second protective layer 140 is formed of photo acryl.

The pixel electrode 151 is used as an electrode for display driving and is connected to the drain electrode 132 of the thin film transistor through a contact hole 141 that is formed in the second protective layer 140.

The connection line 161 (e.g. formed of metal) is on the second protective layer 140. The connection line 161, for example, applies a display driving signal or a touch driving signal to the common electrode 181. The third protective layer 170 is formed on the connection line 161, the pixel electrode 151, and the second protective layer 140.

The common electrode 181 and the pixel electrode 151 are formed on different layers. In a display driving mode of a display device with an integrated touch screen, the common electrode 181 generates an electric field together with the pixel electrode 151 and is thereby used as an electrode for display driving. In a touch driving mode of a display device with an integrated touch screen, the common electrode 181 is used as a touch electrode for sensing a touch.

On the other hand, as illustrated in a portion A of FIG. 1, when the connection line 161 of metal is deposited on the second protective layer 140 of photo acryl, due to an adhesive failure between metal and photo acryl, a peeling problem can occur in a subsequent process after deposition, and thus, there is a possibility that the connection line 161 will be damaged.

Even though the connection line 161 is not damaged due to the peeling problem, when a peeling problem occurs in a boundary portion of an adhesive surface, the boundary portion of the adhesive surface can be contaminated by an etching solution and a stripping solution in an etching process and a stripping process. For this reason, additional cost and time are expended to remove the contamination.

To solve the peeling problem, a buffer passivation layer can be formed between the second protective layer 140 and the connection line 161. In this case, however, cost and time are expended by such an additional process.

Figure 2:
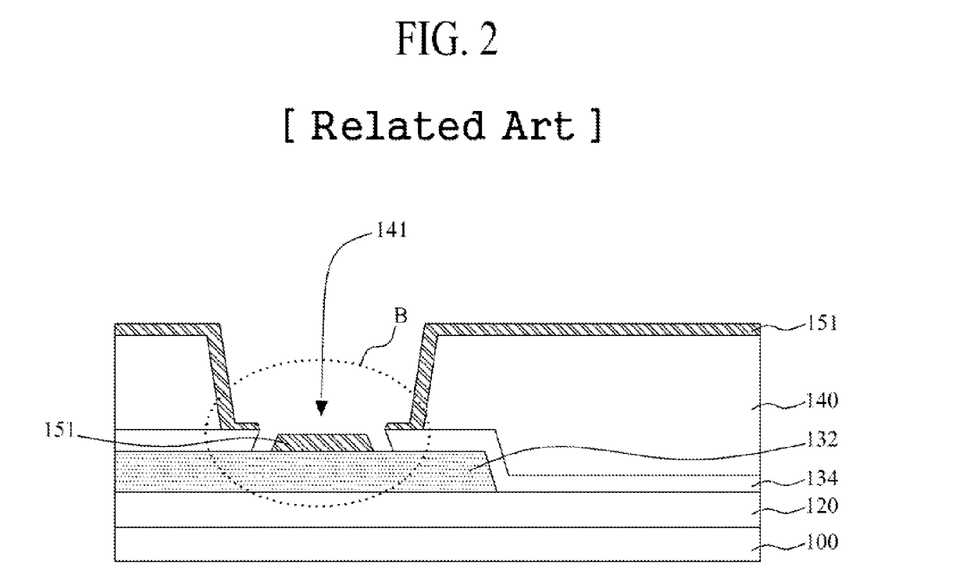
FIGS. 2 and 3 are varied views of portion B of FIG. 1, which illustrates the related art display device.
Figure 3:
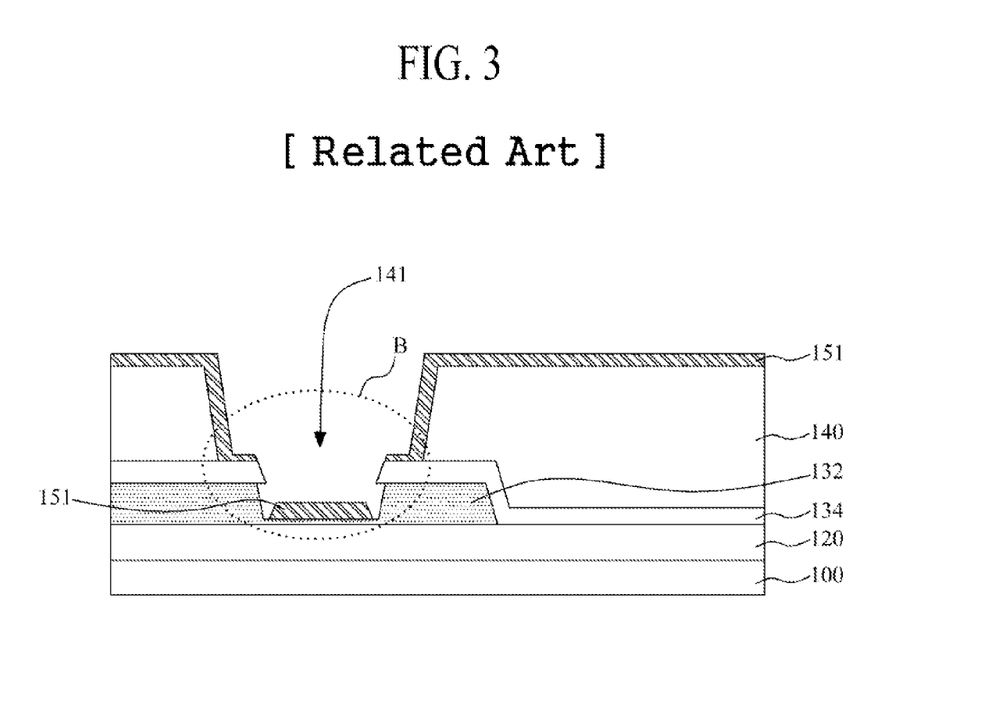

Moreover, as illustrated in FIGS. 2 and 3, in forming the contact hole 141 for connecting the pixel electrode 151 and the drain electrode 132, when the step height of the contact hole 141 is large or an error, such as a reverse taper, occurs in the first protective layer 134, the disconnection of the pixel electrode 151 can occur in a connection portion connected to the drain electrode 132, and the disconnected portion is exposed by the etching solution and the stripping solution, causing the damage of the drain electrode 132.

Some limitations of the related art display device are described below.

First, a peeling problem can occur due to an adhesive failure between the second protective layer of photo acryl and the connection line of metal, resulting in damaging the connection line and/or contaminating the boundary portion of the adhesive surface.

Second, when the buffer passivation layer is formed for solving the peeling problem between photo acryl and metal, cost and time are expended by an additional process.

Third, when the step height of the contact hole for connecting the pixel electrode and the drain electrode is large or when a reverse taper occurs in the first protective layer, the pixel electrode can be disconnected, and the drain electrode in the disconnected portion is damaged by the etching solution and the stripping solution.

SUMMARY

Accordingly, the present disclosure is directed to provide a display device and a method for manufacturing the same that substantially obviate one or more problems due to limitations and disadvantages of the related art.

One aspect of the present disclosure is directed to provide a display device, which can solve a peeling problem and prevent the disconnection of each pixel electrode and the damage of each drain electrode.

Additional advantages and features of some embodiments of the present invention will be set forth in part in the description which follows and in part will become apparent to those having ordinary skill in the art upon examination of the following or may be learned from practice of the disclosure herein. The objectives and other advantages of the invention may be realized and attained by the structure particularly pointed out in the written description and claims hereof as well as the appended drawings.

In one aspect, to achieve these and other advantages and in accordance with the purpose of some embodiments of the invention, as embodied and broadly described herein, a display device according to the present disclosure may include: a thin film transistor including a gate electrode, a source electrode, and a drain electrode; a first protective layer formed on the thin film transistor; a second protective layer formed on the first protective layer; a pixel electrode formed on the second protective layer, and connected to the drain electrode through a first contact hole which exposes the drain electrode; a first connection line formed on the second protective layer at a position corresponding to the source electrode, the first connection line and the pixel electrode being formed of the same material; a second connection line formed on the first connection line; a third protective layer formed on the second connection line, the pixel electrode, and the second protective layer; and a common electrode formed on the third protective layer, the common electrode connected to the second connection line through a second contact hole which exposes the second connection line.

The display device may further include a metal pad disposed on the pixel electrode which is formed in the first contact hole area, the metal pad and the second connection line being formed of the same material.

In another aspect of the present invention, a method of forming a display device according to the present disclosure may include: forming a thin film transistor including a gate electrode, a source electrode, and a drain electrode; forming a first protective layer and a second protective layer on the thin film transistor; patterning the first and second protective layers to form a first contact hole which exposes the drain electrode; forming a transparent conductive layer on the first contact hole and the second protective layer; patterning the transparent conductive layer to form a pixel electrode and a first connection line; forming a metal layer on the pixel electrode, the first connection line, and the second protective layer; patterning the metal layer to form a second connection line on the first connection line; forming a third protective layer on the second connection line, the pixel electrode, and the second protective layer; patterning the third protective layer to form a second contact hole which exposes the second connection line; forming a common electrode layer on the second contact hole and the third protective layer; and patterning the common electrode layer to form a common electrode.

In the forming of a second connection line, a metal pad may be formed on the pixel electrode which is formed in the first contact hole area, simultaneously with the second connection line. In some embodiments, the metal pad and the second connection line may be formed of the same material.

It is to be understood that both the foregoing general description and the following detailed description of the present disclosure are only exemplary and are intended to provide further explanation of the invention as claimed.

BRIEF DESCRIPTION OF THE DRAWINGS

The accompanying drawings, included to provide a further understanding of the present disclosure are incorporated in and constitute a part of this application. The drawings illustrate some embodiments of the invention and together with the description serve to explain the principle of the invention. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts. Detailed description of known arts will be omitted if it is determined that the arts can mislead the present invention.

Hereinafter, embodiments of the present disclosure will be described in detail with reference to the accompanying drawings.

In description of embodiments of the present disclosure, when a structure is described as being formed on or under another structure, this description should be construed as including a case where the structures contact each other and moreover a case where a third structure is disposed therebetween.

Hereinafter, a display device according to various embodiments of the present disclosure will be described in detail with reference to FIGS. 4 to 5.

Figure 4:
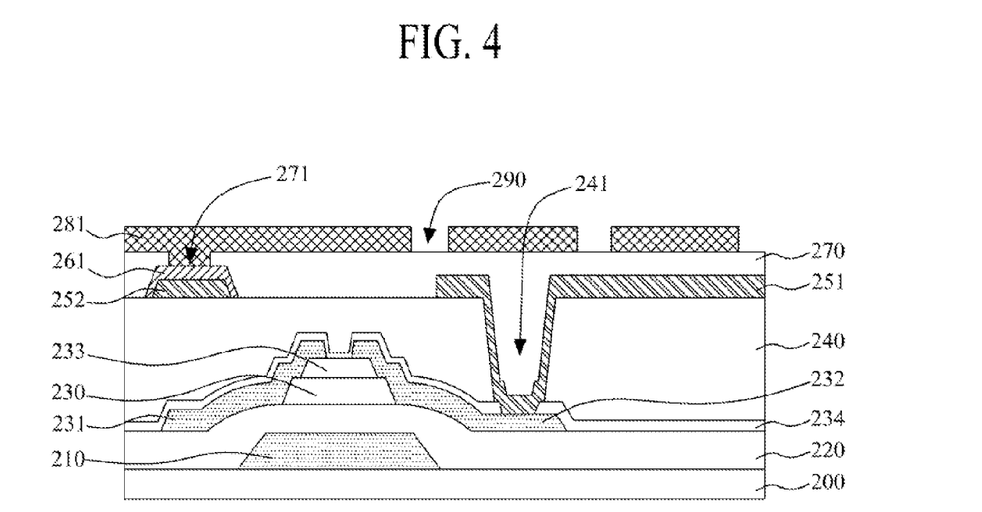
FIG. 4 is a sectional view of a display device according to some embodiments of the present disclosure.

FIG. 4 is a sectional view of a display device according to an embodiment of the present disclosure.

The display device according to some embodiments of the present disclosure as illustrated in FIG. 4, includes a substrate 200, a thin film transistor, a first protective layer 234, a second protective layer 240, a pixel electrode 251, a first connection line 252, a second connection line 261, a third protective layer 270, a common electrode 281, and a slit 290.

The thin film transistor is formed as a switching element, in a pixel area on the substrate 200. The thin film transistor includes a gate electrode 210, a gate insulation layer 220, an active layer 230, a source electrode 231, and a drain electrode 232. In some embodiments, the substrate 200 may be formed of glass or transparent plastic.

The thin film transistor according to the embodiments illustrated in FIG. 4 shows a bottom gate structure where the gate electrode 210 is formed under the active layer 230. The thin film transistor according to other embodiments, however, may have a top gate structure where the gate electrode 210 is disposed on the active layer 230. Also, an etch stopper 233 that protects the active layer 230 in an etching process may be additionally formed on the active layer 230.

The first protective layer 234 may be formed on the thin film transistor and may protect the thin film transistor. In some embodiments, the first protective layer 234 may be formed as a passivation layer. The second protective layer 240 may formed on the first protective layer 234. In some embodiments, the second protective layer 240 may be formed of photo acryl.

The pixel electrode 251 may be formed on the second protective layer 240. Moreover, the pixel electrode 251 may be connected to the drain electrode 232 through a first contact hole 241 that exposes the drain electrode 232. Here, the pixel electrode 251 may be used as an electrode for display driving and may be formed of a transparent conductor, such as indium tin oxide (ITO).

The first connection line 252 is formed in a position corresponding to the source electrode 231 to be separated from the first pixel electrode 251 on the second protective layer 240. The first connection line 252 may be formed in a position fully or partially covering the source electrode 231 as shown in FIG. 4. Here, the first connection line 252 may be formed of the same material as that of the pixel electrode 251 on the same layer as the pixel electrode 251. Moreover, the first connection line 252 may be formed simultaneously with the pixel electrode 251 without requiring an additional process step.

In other words, when the first connection line 252 is formed between the second protective layer 240 and the second connection line 261, the first connection line 252 may have a good adhesive strength to the second protective layer 240. In some embodiments, the first connection line 252 may be formed of an ITO, and/or the second protective layer 240 may be formed of photo acryl. Accordingly, a peeling problem between the second protective layer 240 and the second connection line 261 can be prevented.

Moreover, the first connection line 252 and the pixel electrode 251 may be simultaneously formed of the same material, and thus, an additional process for separately forming the first connection line 252 is not required.

The second connection line 261 may be formed of metal and may be on the first connection line 252. The second connection line 261 may be electrically connected to the first connection line 252. Particularly, the second connection line 261 may be formed of any one material selected from among molybdenum (Mo), aluminum (Al), and copper (Cu), or an alloy thereof. The second connection line 261 may apply a display driving signal or a touch driving signal to the common electrode 281.

The third protective layer 270 may be formed on the second connection line 261, the pixel electrode 251, and the second protective layer 240. The third protective layer 270 may protect the second connection line 261 and the pixel electrode 251. The third protective layer 270 may electrically insulate the pixel electrode 251 and the common electrode 281. The third protective layer 270 may be formed as a passivation layer.

The common electrode 281 may be formed on the third protective layer 270 and may be connected to the second connection line 261 through a second contact hole 271. Here, the common electrode 281 may be used as a display driving electrode or a touch electrode in a display device with an integrated touch screen. The common electrode 281 may be formed of a transparent conductor, such as ITO.

The slit 290 may be formed inside the common electrode 281. The common electrode 281 and the pixel electrode 251 may generate a fringe field with the slit 290, and liquid crystal may be driven by the fringe field.

Figure 5:
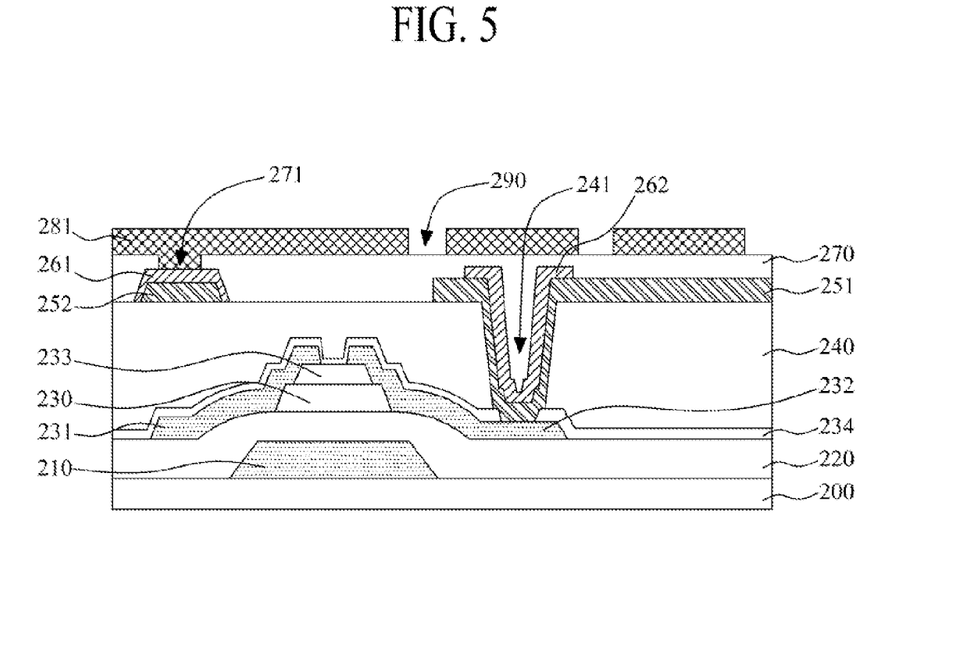
FIG. 5 is a sectional view of a display device according to additional embodiments of the present disclosure.

FIG. 5 is a sectional view of a display device according to another embodiment of the present disclosure.

The display device according to additional embodiments of the present disclosure illustrated in FIG. 5 includes a substrate 200, a thin film transistor, a first protective layer 234, a second protective layer 240, a pixel electrode 251, a first connection line 252, a second connection line 261, a metal pad 262, a third protective layer 270, a common electrode 281, and a slit 290. In some embodiments, the display device may have only one of the second connection line 261 and the metal pad 262. In additional embodiments, the display device having the second connection line 261 and/or the metal pad 262 may not have the first connection line 252.

The metal pad 262 may be formed of the same material as that of the second connection line 261 on the pixel electrode 251 that is formed in a first contact hole 241 area, exposing the drain electrode 232.

In other words, when the metal pad 262 having the same material as that of the second connection line 261 is formed on the pixel electrode 251, the metal pad 262 may peel a disconnected portion of the pixel electrode 232 in the first contact hole 241 lower area, and thus can prevent a contact failure and prevent the damage of the drain electrode 232 due to the penetration of an etching solution.

Moreover, the metal pad 262 and the second connection line 261 may be simultaneously formed of the same material, and thus, an additional process for forming the metal pad 262 is not required.

Hereinafter, a method of manufacturing the display device (having the above-described configuration) according to various embodiments of the present disclosure will be described with reference to FIGS. 6 to 15.

FIGS. 6 to 15 are sectional views illustrating a method of manufacturing a display device according to various embodiments of the present disclosure.

Figure 6:
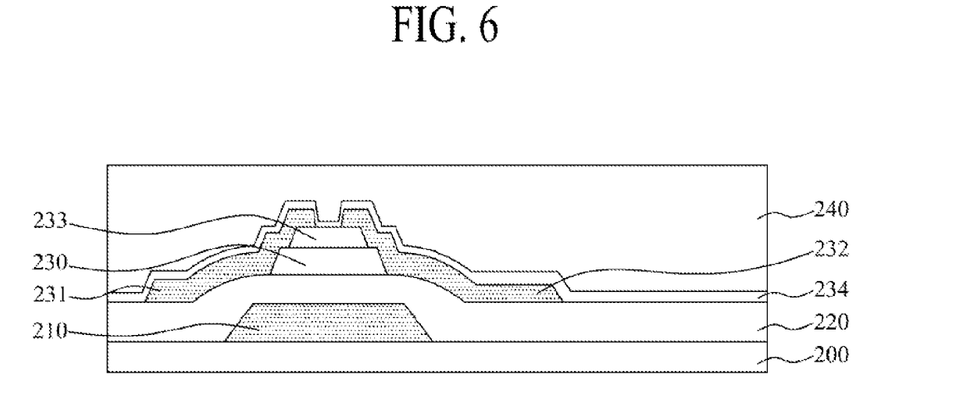
FIGS. 6 to 15 are sectional views illustrating a method of manufacturing a display device according to other embodiments of the present disclosure.

First, as illustrated in FIG. 6, the thin film transistor is formed on the substrate 200, and then the first protective layer 234 and the second protective layer 240 are formed. Particularly, the second protective layer 240 may be formed of photo acryl. The thin film transistor may be formed in a structure where the gate electrode 210, the gate insulation layer 220, the active layer 230, the source electrode 231, and the drain electrode 232 are sequentially stacked therein.

In some embodiments, the thin film transistor has a structure where the active layer 230 is stacked on the gate electrode 210, but the present embodiment is not limited thereto. As another example, the gate electrode 210 may be stacked on the active layer 230, and the etch stopper 233 may be additionally formed on the active layer 230.

Figure 7:
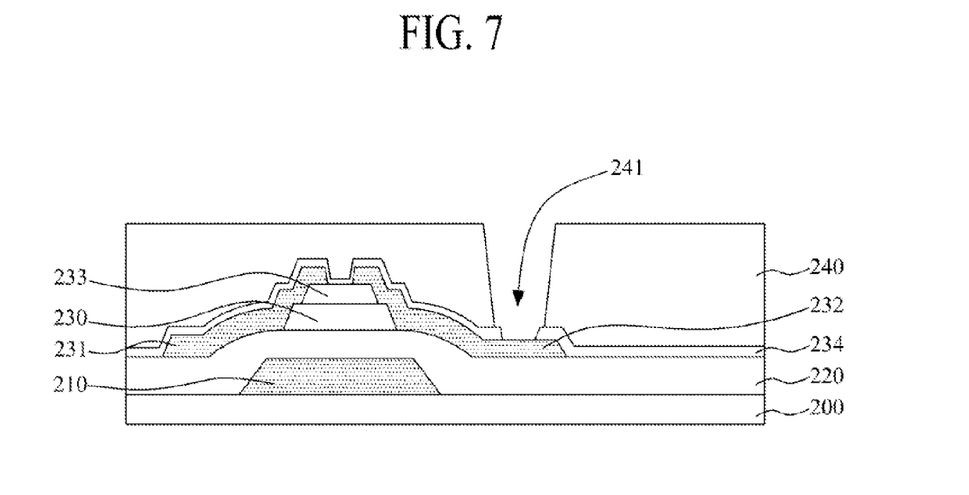

Subsequently, as illustrated in FIG. 7, the first contact hole 241 that exposes the drain electrode 232 of the thin film transistor may be formed by patterning the first protective layer 234 and the second protective layer 240. For example, a photoresist may be coated on the second protective layer 240, and a photoresist pattern may be formed by an exposure and development process. Then, the first contact hole 241 that exposes the drain electrode 232 may be formed by etching the first protective layer 234 and the second protective layer 240 with the photoresist pattern.

Figure 8:
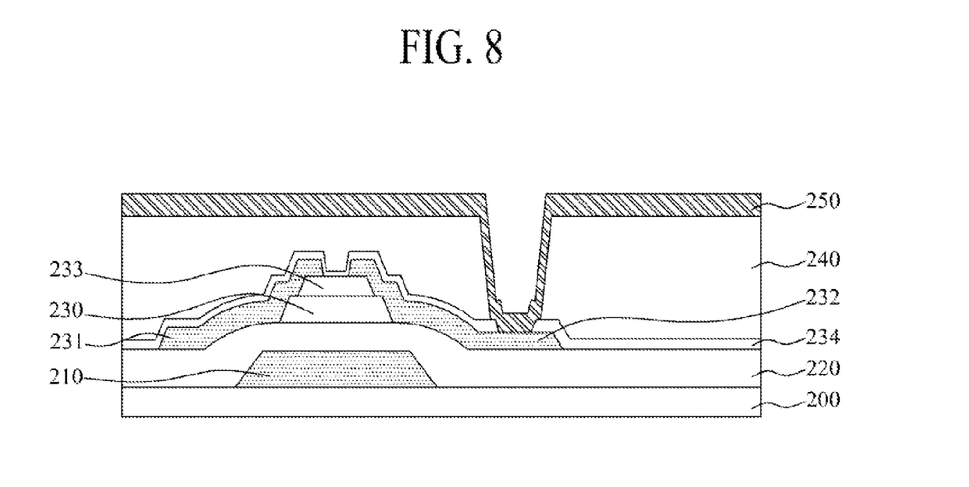

Subsequently, as illustrated in FIG. 8, a transparent conductive layer 250 is formed on the first contact hole 241 shown in FIG. 7 and the second protective layer 240. Herein, the transparent conductive layer 250 may be formed over the second protective layer 240 and inside the first contact hole 241 including a top of the drain electrode 232.

Figure 9:
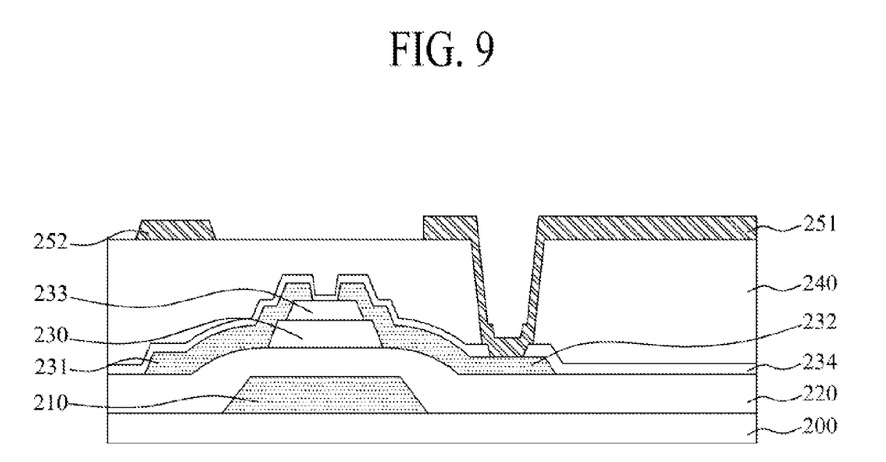

Subsequently, as illustrated in FIG. 9, the pixel electrode 251 and the first connection line 252 may be formed by patterning the transparent conductive layer 250 shown in FIG. 8. Here, the first connection line 252 may be formed at a position, which corresponds to the source electrode 231 on the second protective layer 240, to be separated from the pixel electrode 251. Particularly, the first connection line 252 may be formed as a transparent conductive layer, and thus may have a good adhesive strength to the second protective layer 240 of photo acryl.

Figure 10:
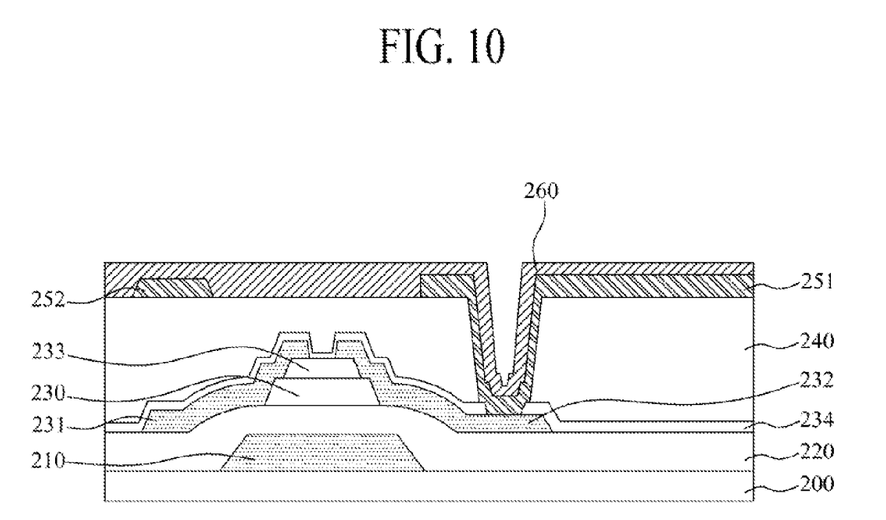

Subsequently, as illustrated in FIG. 10, a metal layer 260 may be formed on the first connection line 252, the pixel electrode 251, and the second protective layer 240. Here, the metal layer 260 may be formed inside the first contact hole 241 on the pixel electrode 251.

Subsequently, the second connection line 261 may be formed by patterning the metal layer 260 as described below.

Figure 11A:
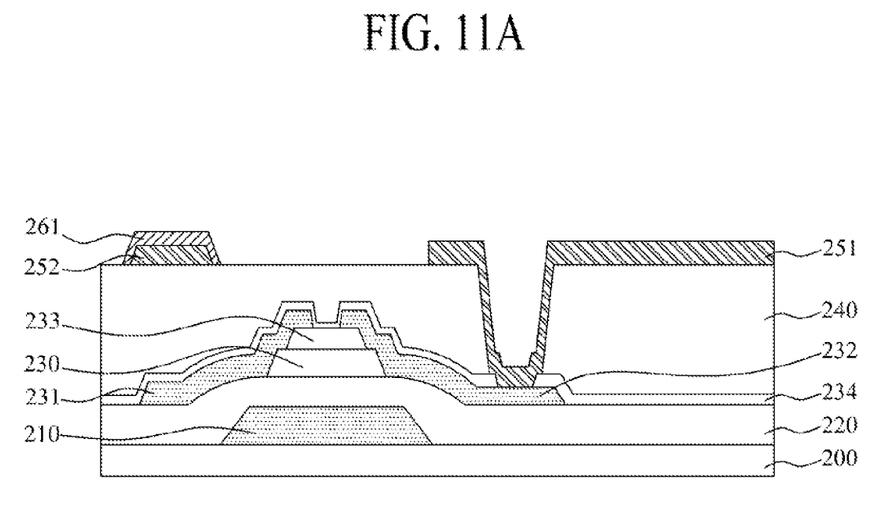
Figure 11B:
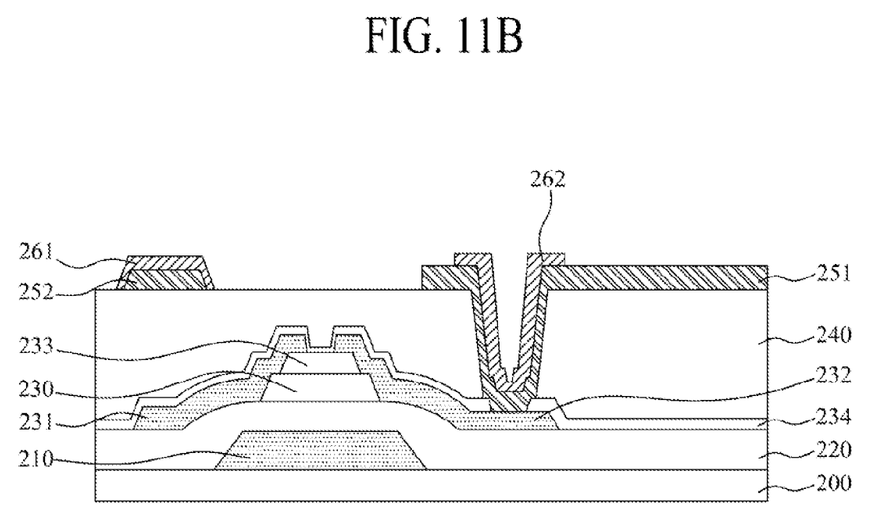

For example, as illustrated in FIG. 11A, the second connection line 261 may be formed by patterning the metal layer 260 as shown in FIG. 10, or as illustrated in FIG. 11B, both the second connection line 261 and the metal pad 262 may be simultaneously formed by patterning the metal layer 260. In additional embodiments, only the metal pad 262 may be formed by patterning the metal layer 260.

Here, the second connection line 261 may be formed of metal on the first connection line 252. The second connection line 261 may be electrically connected to the first connection line 252. Particularly, the second connection line 261 may be formed of any one material selected from among Mo, Al, and Cu, or an alloy thereof.

Moreover, the metal pad 262 may be electrically connected to the pixel electrode 251 in the first contact hole 241 area. The metal pad 262 may prevent the disconnection of the pixel electrode 251 under the first contact hole 241 and the damage of the drain electrode 232 due to the penetration of an etching solution.

Figure 12:
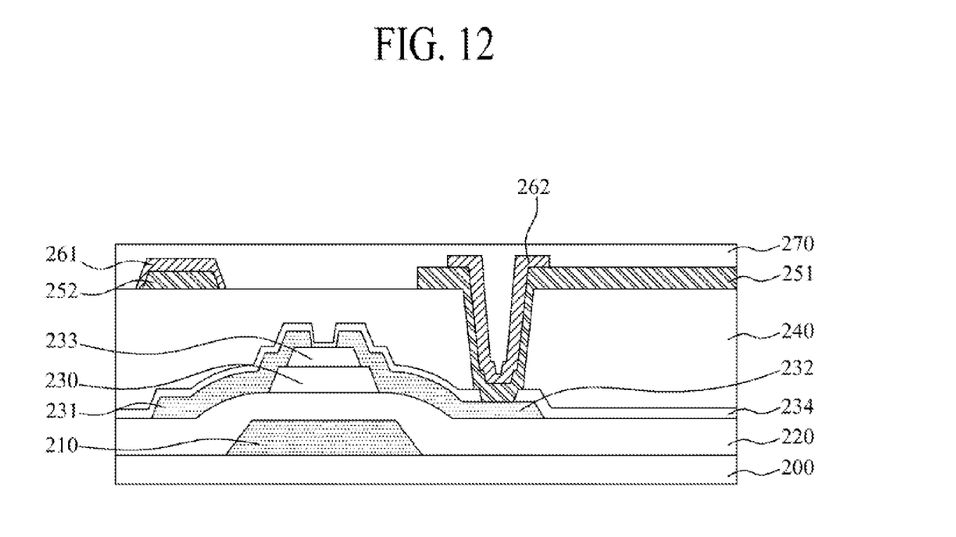

Subsequently, as illustrated in FIG. 12, a third protective layer 270 may be formed on the second connection line 261, the pixel electrode 251, the metal pad 262, and the second protective layer 240.

Figure 13:
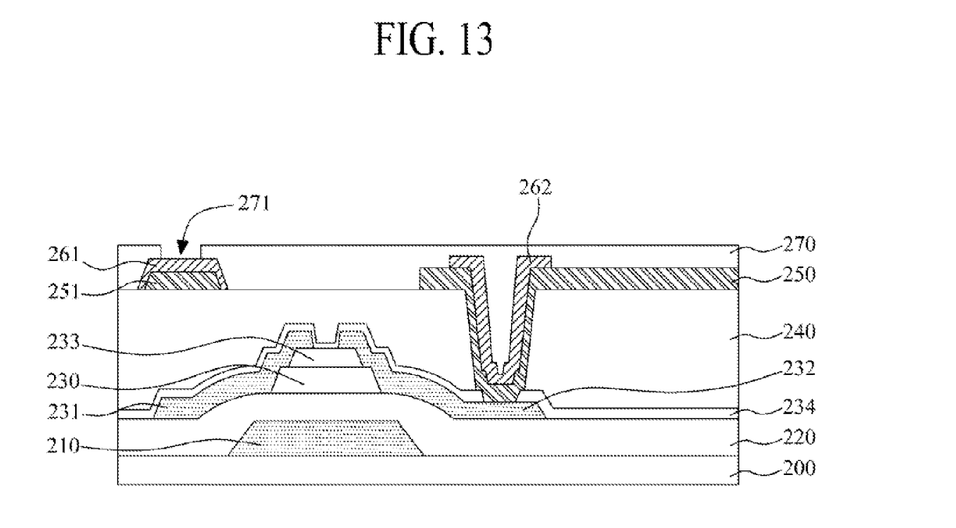

Subsequently, as illustrated in FIG. 13, the second contact hole 271 that exposes the second connection line 261 may be formed by patterning the third protective layer 270.

Figure 14:
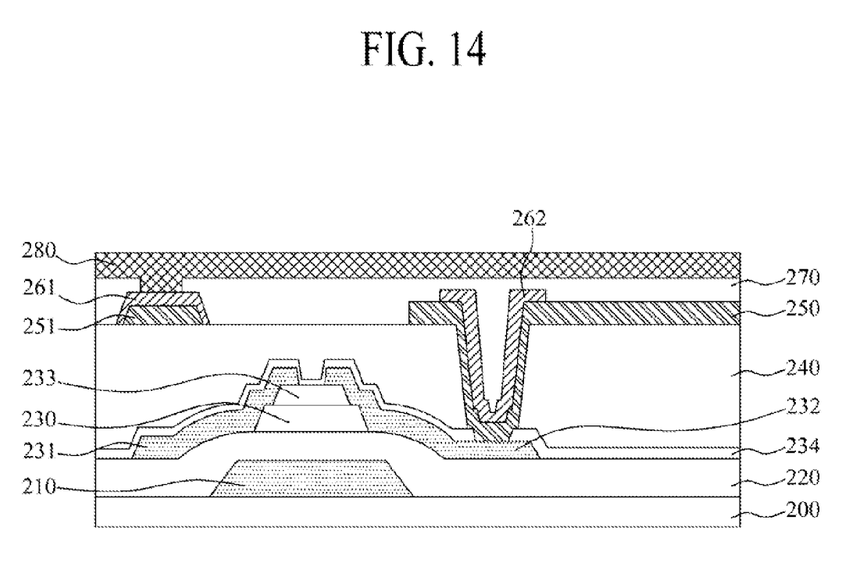

Subsequently, as illustrated in FIG. 14, a common electrode layer 280 may be formed on the second contact hole 271 and the third protective layer 270. Here, the common electrode layer 280 may be electrically connected to the second connection line 261 through the second contact hole 271 shown in FIG. 13.

Figure 15:
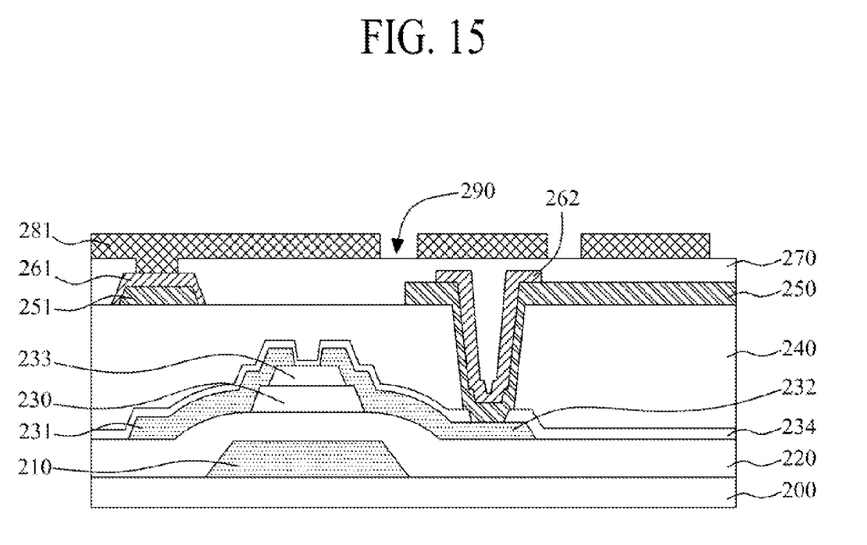

Subsequently, as illustrated in FIG. 15, the common electrode 281 may be formed by patterning the common electrode layer 280 shown in FIG. 14. Here, the common electrode 281 may include the slit 290.

The method of manufacturing the display device is described above as performing only up to the process of forming the common electrode, but the scope of the present disclosure is not limited thereto. The method may include the process of forming the common electrode and may further include an additional process for manufacturing the display device with integrated display device.

As described herein, according to some embodiments of the present invention, in the display device, when forming the pixel electrode, a material which is the same as that of the pixel electrode may be additionally formed between the second protective layer (e.g. of photo acryl) and the connection line (e.g. of metal), and thus, the peeling problem between the second protective layer and the connection line may be solved.

Moreover, according to additional embodiments of the present invention, the additional line may be formed of the same material as that of the pixel electrode by the same process as the pixel electrode, and thus, the peeling problem may be solved without an additional process.

Furthermore, according to further embodiments of the present invention, in the display device, when forming the second connection line, a material which is the same as that of the second connection line may be formed on the pixel electrode in the contact hole area, and thus, the disconnection of the pixel electrode may be prevented in the connection portion between the pixel electrode and the drain electrode, and the damage of the drain electrode due to the disconnection of the pixel electrode may be prevented.

It will be apparent to those skilled in the art that various modifications and variations can be made in the present invention without departing from the spirit or scope of the inventions. Thus, it is intended that the present disclosure covers the modifications and variations of this invention provided they come within the scope of the appended claims and their equivalents.

What is claimed is:

1. A display device comprising:
a thin film transistor comprising a gate electrode, a source electrode, and a drain electrode;
a first protective layer formed on the thin film transistor;
a second protective layer formed on the first protective layer;
a pixel electrode formed on the second protective layer, the pixel electrode being connected to the drain electrode through a first contact hole which exposes the drain electrode;
a first connection line formed on the second protective layer at a position corresponding to the source electrode, the first connection line and the pixel electrode being formed of the same material;
a second connection line formed on the first connection line, wherein both the first and second connection lines are disposed above the source electrode, the second connection line overlapping the first connection line, the first connection line formed between the second protective layer and the second connection line, the first connection line thereby adhering to the second protective layer, wherein the second connection line is formed of metal;
a third protective layer formed on the second connection line, the pixel electrode, and the second protective layer; and
a common electrode formed on the third protective layer, wherein the common electrode is connected to the second connection line through a second contact hole which exposes the second connection line at the position corresponding to the source electrode.

2. The display device according to claim 1, further comprising a metal pad on the pixel electrode, wherein the metal pad is formed of the same material as that of the second connection line.

3. The display device according to claim 1, wherein the first and third protective layers are passivation layers.

4. The display device according to claim 1, wherein the second protective layer comprises photo acryl.

5. The display device according to claim 1, wherein the first and third protective layers are passivation layers, and the second protective layer comprises photo acryl.

6. The display device according to claim 1, wherein
the common electrode comprises a slit; and
the common electrode and the pixel electrode are configured to generate a fringe field with the slit.

7. The display device according to claim 1, wherein the thin film transistor further comprises a gate insulation layer, an active layer, and an etch stopper, wherein the active layer is disposed on the gate electrode.

8. The display device according to claim 1, wherein the thin film transistor further comprises a gate insulation layer, an active layer, and an etch stopper, wherein the gate electrode is disposed on the active layer.

9. The display device according to claim 1, wherein the display device is with an integrated touch screen, the common electrode layer is a touch electrode during a touch driving mode, and the common electrode layer is a display driving electrode during a display driving mode.

10. A method of forming a display device comprising:
forming a thin film transistor comprising a gate electrode, a source electrode, and a drain electrode;
forming a first protective layer and a second protective layer on the thin film transistor;
patterning the first and second protective layers to form a first contact hole which exposes the drain electrode;
forming a transparent conductive layer on the first contact hole and the second protective layer;
patterning the transparent conductive layer to form a pixel electrode and a first connection line;
forming a metal layer on the pixel electrode, the first connection line, and the second protective layer;
patterning the metal layer to form a second connection line on the first connection line;
forming a third protective layer on the second connection line, the pixel electrode, and the second protective layer;
patterning the third protective layer to form a second contact hole which exposes the second connection line;
forming a common electrode layer on the second contact hole and the third protective layer; and
patterning the common electrode layer to form a common electrode.

11. A display device comprising:
a thin film transistor comprising a gate electrode, a source electrode, and a drain electrode;
a first protective layer formed on the thin film transistor;
a second protective layer formed on the first protective layer;
a pixel electrode formed on the second protective layer, the pixel electrode being connected to the drain electrode through a first contact hole which exposes the drain electrode;
a metal pad on the pixel electrode, wherein the metal pad is inside the first contact hole on the pixel electrode, the pixel electrode formed between the metal pad and the drain electrode in the first contact hole,
a connection line formed at a position corresponding to the source electrode on the second protective layer, the connection line and the metal pad being formed of the same material;
a third protective layer formed on the connection line, the pixel electrode, and the second protective layer; and
a common electrode formed on the third protective layer, the common electrode connected to the connection line through a second contact hole which exposes the connection line.

12. The display device according to claim 11, wherein the first and third protective layers are passivation layers.

13. The display device according to claim 11, wherein the second protective layer comprises photo acryl.

14. The display device according to claim 11, wherein the first and third protective layers are passivation layers, and the second protective layer comprises photo acryl.

15. The display device according to claim 11, wherein
the common electrode comprises a slit; and
the common electrode and the pixel electrode are configured to generate a fringe field with the slit.

16. The display device according to claim 11, wherein the thin film transistor further comprises a gate insulation layer, an active layer, and an etch stopper, wherein the active layer is disposed on the gate electrode.

17. The display device according to claim 11, wherein the thin film transistor further comprises a gate insulation layer, an active layer, and an etch stopper, wherein the gate electrode is disposed on the active layer.

18. The display device according to claim 11, wherein the display device is with an integrated touch screen, the common electrode layer is a touch electrode during a touch driving mode, and the common electrode layer is a display driving electrode during a display driving mode.

19. The display device according to claim 11, further comprising:
an other connection line formed on the second protective layer, the other connection line and the pixel electrode being formed of the same material,
wherein both the connection line and the other connection line are disposed above the source electrode, the connection line overlapping the other connection line.

* * * * *